United States Patent [19]

Grabbe

[11] Patent Number: 4,969,826
[45] Date of Patent: Nov. 13, 1990

[54] HIGH DENSITY CONNECTOR FOR AN IC CHIP CARRIER

[75] Inventor: Dimitry G. Grabbe, Middletown, Pa.

[73] Assignee: AMP Incorporated, Harrisburg, Pa.

[21] Appl. No.: 464,624

[22] Filed: Jan. 3, 1990

Related U.S. Application Data

[63] Continuation-in-part of Ser. No. 446,900, Dec. 16, 1989, abandoned.

[51] Int. Cl.[5] .......................................... H01R 23/72
[52] U.S. Cl. ...................................... 439/66; 29/876; 439/937
[58] Field of Search ........................... 439/66, 68–71, 439/91, 937; 29/876

[56] References Cited

U.S. PATENT DOCUMENTS

| | | | |
|---|---|---|---|
| 4,199,209 | 4/1980 | Cherian et al. | 339/59 M |
| 4,344,662 | 8/1982 | Dalamangas | 439/331 |
| 4,699,593 | 10/1987 | Grabbe et al. | 439/71 |
| 4,906,194 | 3/1990 | Grabbe | 439/71 |

FOREIGN PATENT DOCUMENTS

8867/64 7/1966 Switzerland ..................... 439/701

OTHER PUBLICATIONS

IBM Bulletin, vol. 17, No. 2, page 444, Faure et al., 7-1974.

Primary Examiner—Neil Abrams
Attorney, Agent, or Firm—James M. Trygg

[57] ABSTRACT

The present invention is an interposer connector assembly having a small contact grid spacing for interconnecting a relatively large integrated circuit chip carrier with a printed circuit board. The interposer connector assembly includes a holder which is composed of several thin plates having perforations arranged on the desired grid patterns. The thin plates are stacked with their perforations in alignment to form through openings in the holder. Contact modules are then inserted into the through openings to complete the connector assembly. The contact modules comprise a two part plastic housing with a contact member contained in a cavity formed by mating the two parts. The two parts are formed on continuous strips of extruded plastic.

10 Claims, 5 Drawing Sheets

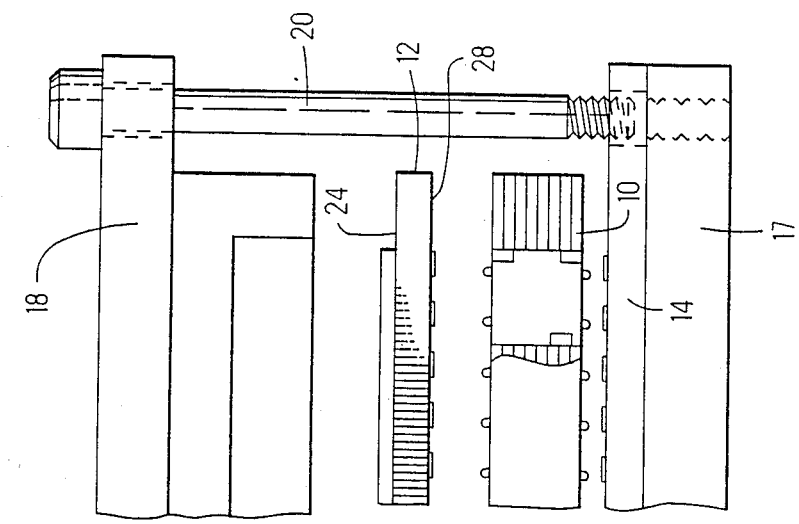
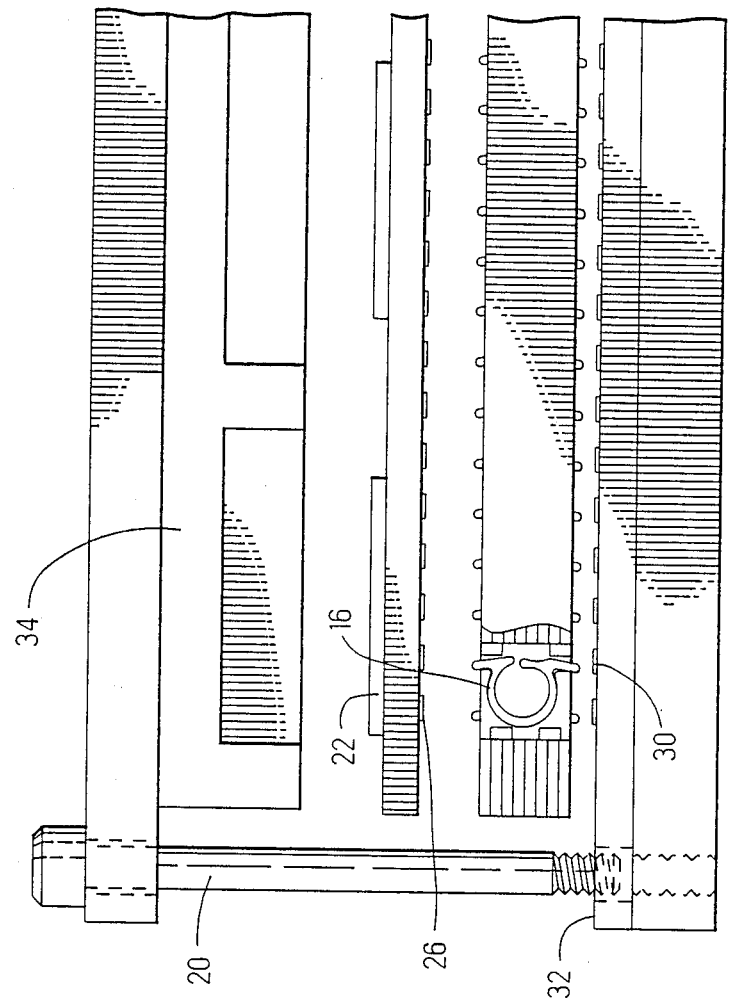
FIG. 1

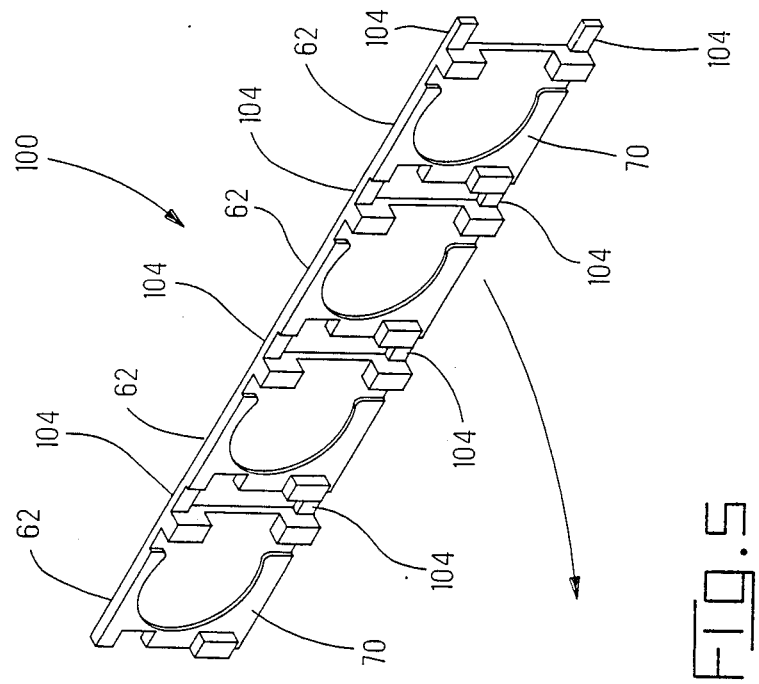
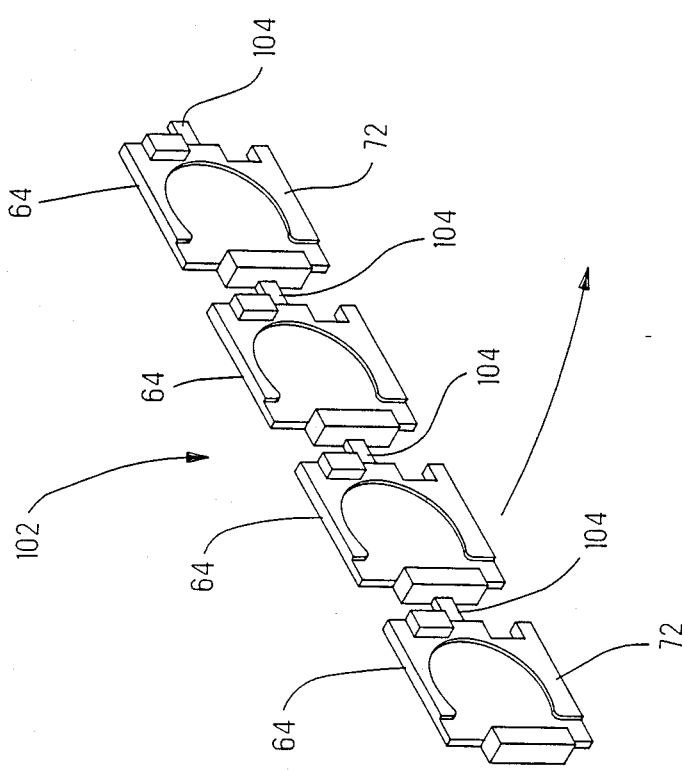
Fig. 5

HIGH DENSITY CONNECTOR FOR AN IC CHIP CARRIER

This application is a Continuation in Part of Application Ser. No. 446,900 filed Dec. 6, 1989, now abandoned.

BACKGROUND OF THE INVENTION

This invention relates to connectors for integrated circuit chips and multi-chip substrates and, more particularly, to such a connector which provides for high density contacts in a separable assembly.

Integrated circuits (IC's) are conventionally carrier on silicon or ceramic modules which are like miniature printed circuit boards on which an interconnection pattern (in one or more layers) and contact pads are deposited on the silicon. Such substrates may also incorporate active devices, line drivers, receivers, etc. A module may contain several IC chips which are mounted on the substrate by means of flip chip, wire bond or tape automated bonding methods, for example. This technology results in a very high interconnection density on the module. For example, the flip chip technology utilizes only 0.001 inch high solder bumps on centers as small as 0.004 inch to yield an extremely dense package. The modules are then interconnected via a printed circuit board. For reasons of minimizing the impact of signal propagation delay, such modules must be interconnected in as small an area as possible. Accordingly, it is an object of this invention to provide an assembly for the high density connection of an IC chip module to a printed circuit board or similar substrate.

In terms of connector density, the technology of connector assemblies has progressed from plated-through hole mounted contacts, to pin and socket combinations, to surface soldering, to the current use of interposers, the latter being exemplified by U.S. Pat. No. 4,699,593, issued on Oct. 13, 1987 and assigned to the assignee of the present invention. The interposer and similar methods typically use an insulator as a means of positioning or orienting contacts, which typically are spring members. However, when the dimensions of the plastic material separating adjacent contacts is below certain limits, the traditional technology of molding plastic becomes inadequate. There is a limitation of the space between core pins in the mold into which the plastic will flow, making it difficult to provide an adequate packing density and retain at least some mechanical strength when extracted from the mold. The technology of liquid reaction injection molding is better able to produce small geometries. However, this is associated with difficulty in manufacturing small geometries without flash, which frequently dimensionally approaches the size of the contact separators or ribs. Additionally, since it is desirable to have a controlled characteristic impedance of the signal from the module to the printed circuit board without discontinuity, the use of plastics imposes a limitation, since the close proximity of the contacts results in cross talk therebetween. This cross talk problem may be alleviated by connecting alternate contacts to ground to provide a reference ground. However, this severely impacts the interconnection density which can be achieved. It is therefore a more specific object of this invention to provide a connector assembly between the IC chip module and a printed circuit board which has controlled impedance, wave guide properties, low electrical resistance, short electrical length, high density and reliability.

Occasionally, an IC module becomes defective after installation on a printed circuit board. In such case, it is desirable to be able to replace such a module without requiring the replacement of the entire printed circuit board. Accordingly, it is a further object of this invention to provide a connector assembly which satisfies all of the foregoing requirements and, in addition, is separable to allow replacement of the module.

SUMMARY OF THE INVENTION

The foregoing and additional objects are attained in accordance with the principles of the present invention by providing a separable connector assembly wherein a plurality of identical contact modules are provided having an insulating body and a contact member. A holder is provided having a plurality of openings formed therethrough. Each opening is positioned in the holder and sized to receive a respective contact module so that the contacting surfaces of the contact modules are held in a spaced array corresponding to the spacing of the contact pads on the chip carrier and the corresponding contact pads on the substrate to which the chip carrier is to be interconnected.

In accordance with a feature of this invention the holder is made of a plurality of relatively thin metal plates which are stacked together.

BRIEF DESCRIPTION OF THE DRAWINGS

FIG. 1 is a semi-exploded cross-sectional view through a typical connector assembly illustrating the teachings of the present invention;

FIG. 5 is an isometric view showing a portion of the formed strips shown in FIG. 6.

DESCRIPTION OF THE PREFERRED EMBODIMENT

Figure 2:
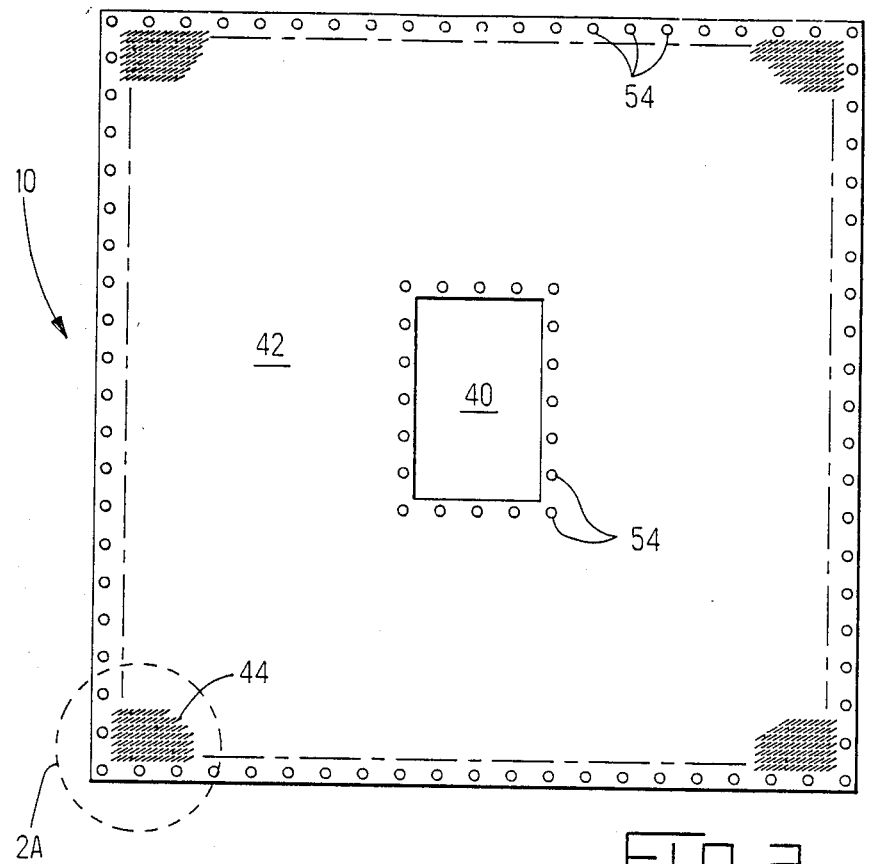
FIG. 2 is a plan view of the connector assembly shown in FIG. 1.

There is shown in FIG. 1, an exploded parts view of an interposer connector assembly 10 for interconnecting contact pads on an integrated circuit (IC) chip carrier 12 with contact pads on a printed circuit board (PCB) 14, or other metalized substrate. As will be set forth in detail below, the connector assembly 10 includes a plurality of contact members 16 which project from both sides of the connector 10 for electrical engagement with the pads on both the chip carrier 12 and the PCB 14. Mating of these contacts with their respective pads is accomplished by sandwiching the connector 10 between the chip carrier 12 and PCB 14 by means of a relatively rigid base 17 and compression plate 18 which are bolted together with the bolts 20. The chip carrier 12 includes a plurality of surface mounted IC chips 22 secured to its planar surface 24. The circuit elements contained within the chips 22 are connected to contact pads 26 which are positioned on a planar surface 28 of the chip carrier 12. A plurality of contact pads 30 are disposed on a planar surface 32 of the PCB 14. When the bolts 20 are tightened in place, the contact members 16 are brought into engagement with their respective pads 26 and 30 causing the contact elements 16 to deflect. Each such contact element 16 requires a force of about 150 grams to properly deflect. Large chip carriers can require substantial forces to properly engage all of the contact elements 16. For example, the present chip carrier 12 is about 8 inches by 8 inches and includes 25,000 contact pads 26 on the surface 28. The interposer connector assembly 10, therefore, must have 25,000 contact member 16, each requiring a force of 150 grams. This results in a total force of about 8,000 pounds required to properly mate the connector assembly 10 with the chip carrier 12 and PCB 14. To assist the chip carrier 10 in withstanding such force levels a honeycomb support 34 is attached to the pressure plate 18 and is arranged to abut the surface 24 of the chip carrier 12 in the areas surrounding the IC chips 22. In this way substantial force can be applied without the danger of deflecting the chip carrier 12 beyond its permissible level.

Figure 2A:
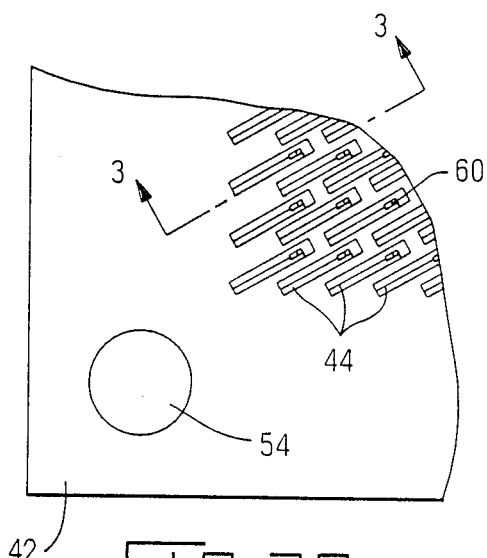
FIG. 2A is an enlarged view of a portion of the connector of FIG. 2.
Figure 3:
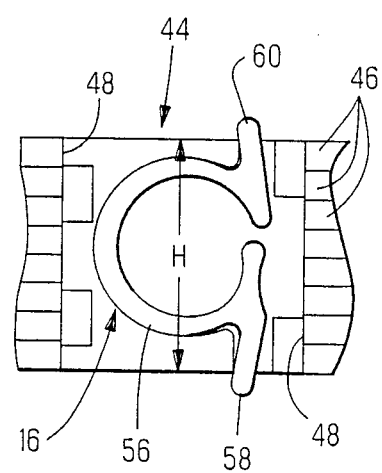
FIG. 3 is a cross-sectional view taken along the lines 3—3 of FIG. 2A.

FIGS. 2, 2A, and 3 show more details of the interposer connector assembly 10. FIG. 2 is a plan view of the connector 10 showing a substantially square structure having a central opening 40 to provide for the passage of power electrodes and other such structures. The connector assembly 10 consists of a holder 42 and a number of contact modules 44, 25,000 in the present example. The holder 42 is composed of several relatively thin plates 46 which are stacked to achieve a thickness substantially equal to the height H of the contact module 44, see FIG. 3, which is 0.090 inch in the present example. The plates 46 are all cut to the identical size and shape, while square in the present example other shapes may be advantageously used. A series of perforations 48 are formed through each plate by any suitable means such as, for example, by photolithographic masking followed by etching. The series of perforations 48 are formed in a desired pattern to correspond to the pattern of the contact pads 26 and 30 of the chip carrier 12 and the PCB 14 respectively. In the present example an X-Y grid pattern having a center to center spacing of 0.050 inch is required. To achieve this, the perforations 48 are angled and arranged as best seen in FIG. 2A. Each perforation 48 is 0.015 inch wide and 0.095 inch long, in the present example, and is disposed on about a 30 degree angle to the horizontal. The individual plates 46, having the perforations, are then stacked in alignment so that the individual perforations 48 line up and form openings 50 completely through the holder 42. The plates are made of metal so that, when pressed together with the contact modules 44 in place, each contact is surrounded by metal thereby greatly reducing cross-talk between contacts. Any suitable means may be utilized to hold the plates together so that they form a single rigid structure. In the present example the plates were spot welded together using an electrode tip of 0.125 dia at a current level of 100 amperes. The spot welds 54 are spaced on about 0.375 inch centers about the periphery of the holder 42 and adjacent the central opening 40.

As shown in FIG. 3, the contact member 16 includes a resilient portion 56 and first and second contact portions 58 and 60 respectively. This contact member 16, as shown in FIG. 3, is more fully described in copending U.S. Pat. application Ser. No. 337,730, filed Apr. 13, 1989, now U.S. Pat. No. 4,906,194, and assigned to the present assignee. However, it will be understood that any similar suitable contact may be utilized in the practice of the present invention.

Figure 4:
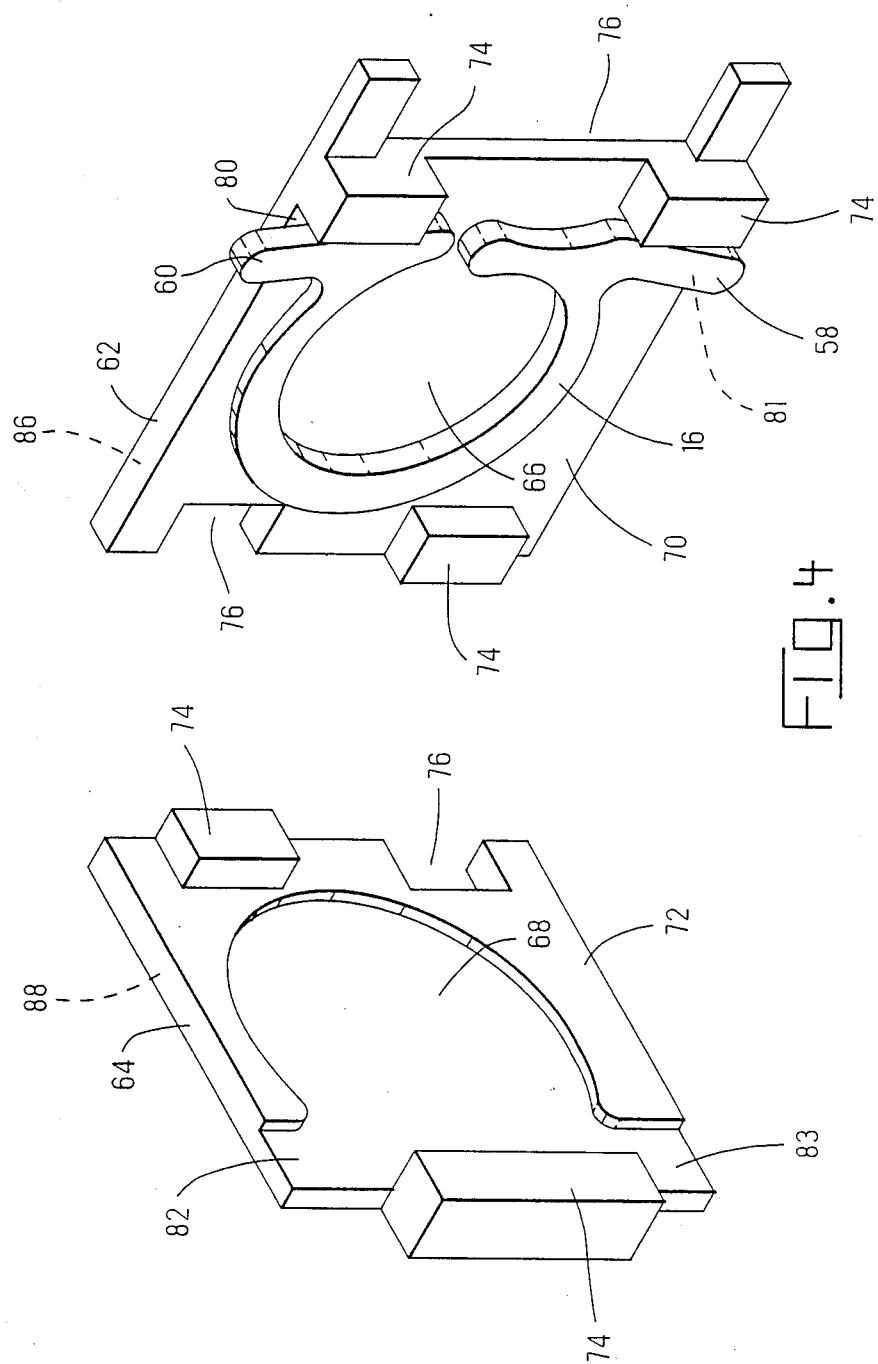
FIG. 4 is an isometric view showing a single contact module partially assembled.

The details of the contact module 44 are more particularly shown in FIG. 4. As is shown, the module 44 includes an insulating body comprising a first part 62 and a second part 64, and the contact member 16. The two parts 62 and 64 each include a portion 66 and 68 of a cavity formed in the flat surfaces 70 and 72 respectively. Additionally, the two parts 62 and 64 have interdigitated features such as the projections 74 which mate with the openings 76. When the two parts 62 and 64 are brought together with their surfaces 70 and 72 in abutting contact, the projections 74 engage the openings 76 thereby mutually aligning the parts so that the two portions 66 and 68 form an internal cavity for holding the contact member 16. Each cavity portion 66 and 68 also includes opening halves 80, 81, 82, and 83 respectively so that the opening halves 80 and 82 form an opening through which the contact portion 60 projects and the opening halves 81 and 83 form an opening through which the contact portion 58 projects in mutually opposite directions. The internal cavity formed by the portions 66 and 68 and the openings formed by the halves 80, 81, 82, and 83 are all substantially coplanar and are sized to receive the contact member 16 and to permit deflection of the contact within the plane of the cavity and openings without binding. The two parts 62 and 64, when mated with a contact member 16, form the contact module 44 having substantially flat and parallel outer surfaces 86 and 88. The module 44 has a thickness (distance between the outer surface 86 and 88) of 0.015 inch, a height of 0.090 inch and a length of 0.095 inch, as viewed in FIG. 4 in this example.

The two parts 62 and 64 are formed in relatively long continuous strips 100 and 102 respectively as shown in FIG. 5. The parts 62 and 64 are interconnected with the links 104 which are removed prior to inserting the module 44 into the openings 50 in the holder 42.

Figure 6:
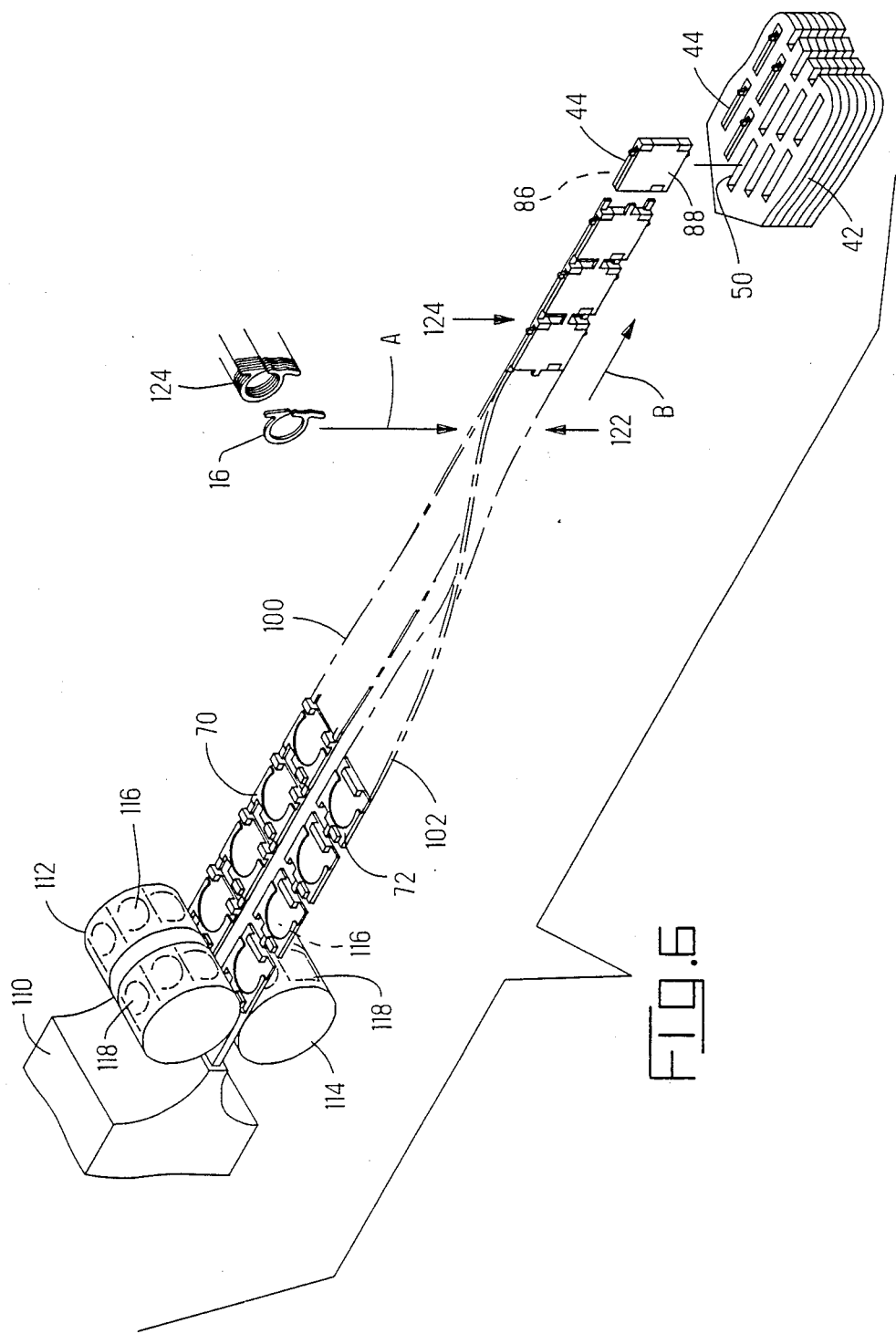
FIG. 6 is an isometric schematic diagram depicting a method of making the contact module and connector assembly according to the teachings of the present invention.

As shown in FIG. 6, the strips 100 and 102 are manufactured by extruding plastic into strips, having a substantially rectangular cross section, by means of a plastic extrusion die 110. The plastic which is extruded may be any suitable dielectric such as, for example, Vectra LCP which is manufactured by Celanise Corp. of America, 81 Morris Avenue, Summit, N.J. 07901 or other similar material. The extruded plastic strips may be about 0.006 inch thick and about 0.090 inch wide. While the plastic strips are still hot and deformable, they are passed between a pair of rollers 112 and 114. The rollers 112, 114 contain die structures 116 and 118 in their outer surface which deform the plastic and form the strips 100 and 102 respectively. The rollers 112 and 114 are rotated in mutually timed relation so that the individual parts 62 and 64 are formed in the strips 100 and 102 respectively. It will be understood that these strips may also be formed by compacting the plastic strips in a punch and die combination As the strips 100 and 102 processed from left to right, as viewed in FIG. 6, the strips 100, 102 are gradually rotated toward each other so that their respective surfaces 70 and 72 are opposed and approximately parallel as shown at 122 in FIG. 6. At this point a contact member 16 is taken from a supply 124 of contacts and inserted between the two strips 100, 102 in alignment with the cavity portions 66 and 68 of one pair of parts 62 and 64. The contact is inserted in the direction of the arrow A and, because the strips are moving in the direction of the arrow B, the contact also undergos a lateral motion in the direction of the arrow B. During this lateral motion, the two strips 100 and 102 are merged close together so that the inserted contact member 16 is captured within the two approaching cavity portions 66 and 68. The insertion tool is then withdrawn and the merging of the two strips 100, 102 continues until the surfaces 70 and 72 are in abutting contact and the projections 74 are in mating engagement with their respective openings 76, as shown at 124 in FIG. 6. At this point, the continuous strip of modules 44, which are interconnected by the links 104, may be wound onto a reel, not shown, and stored for subsequent use. More conveniently, at this point, the individual modules 44 may be severed from the strip and inserted into an opening 50 of the holder 42. When the module 44 is severed from the strip, the links 104 associated with that module are also severed and discarded Alternatively, the two strips 100 and 102 may be connected at their opposing edges by a thin web or portions of a web of material. As the strips move toward the point 122 of FIG. 6, the web acts as a hinge as the two strips are folded toward each other. This web may then be removed along with the links 104.

Apparatus for extruding the plastic through the die 110, operating the rollers 112, 114, guiding the strips 100, 102, inserting the contact member 16, merging the strips 100, 102 into a mated assembly, and severing the individual modules 44 and inserting them into the holder 42 is well known in the industry as individual apparatus for performing each individual function. However, it is now known to combine those individual functions into a single method for making the connector modules 44 or the interposer connector assembly 10 of the present invention.

Figure 7:
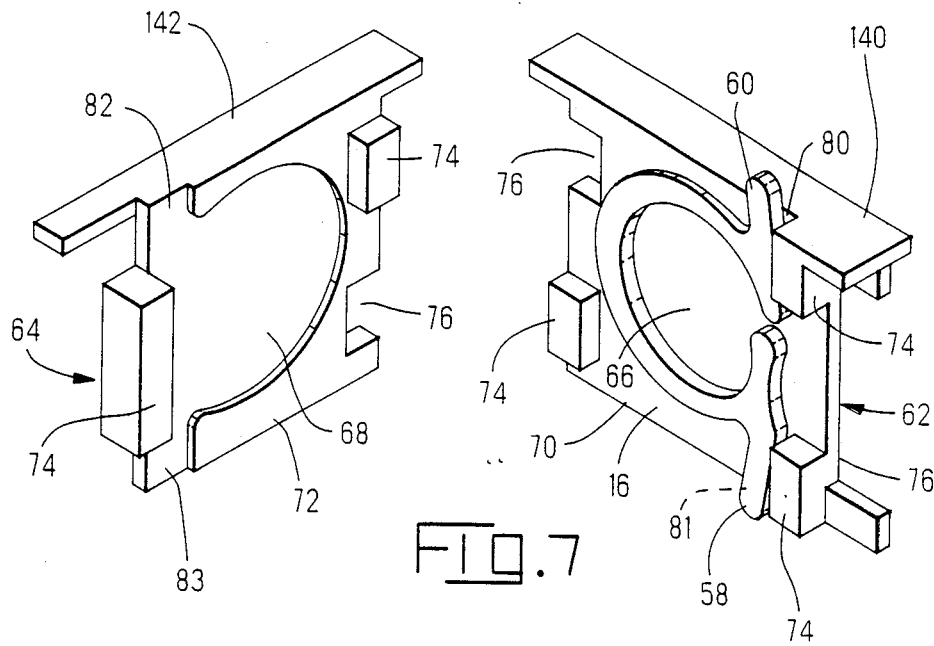
Figure 8:
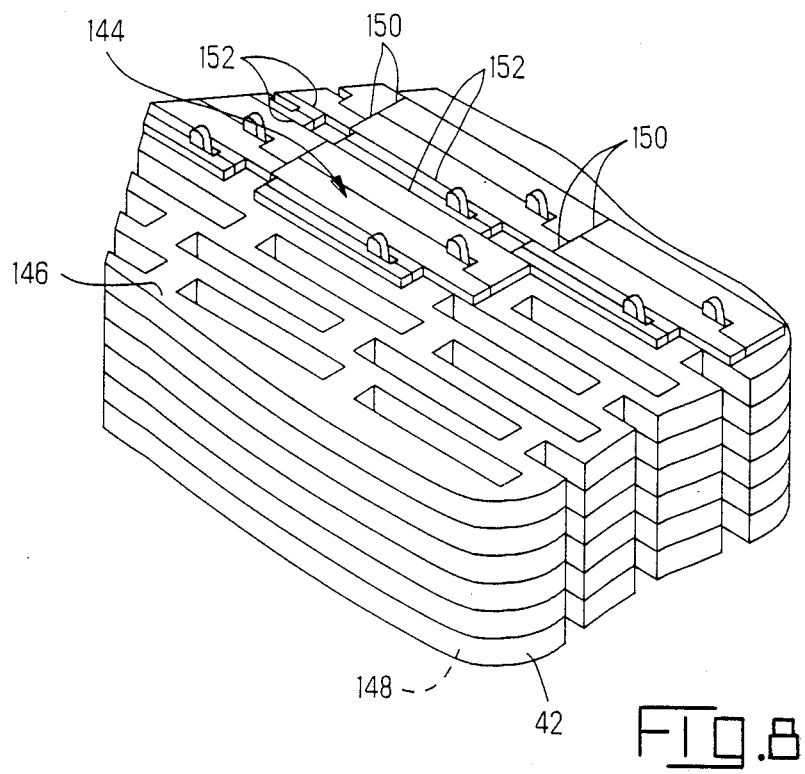

In this case where the holder 42 is electrically conductive, it may be desirable to electrically insulate it from the chip carrier 12 and the printed circuit board 14. This may be done by providing a thin sheet of insulating material therebetween. However, it is expensive to manufacture such an insulating sheet having the fine array of small holes that must accurately align with the contact portions 58 and 60. A better solution is to construct the insulating sheet from a plurality of segments which are a part of each individual contact module 44. Such a structure, a second embodiment of the invention, is shown in FIGS. 7 and 8. In these figures, elements which are similar to those of the first embodiment have similar identifying numbers. As shown in FIG. 7 an insulating sheet segment or flange 140 is integral with the top end of the part 62 and a similar segment or flange 142 is integral with the top end of the part 64. The thickness of each of the flanges 140 and 142 is, in the present example, about 0.005 inch. When the two parts 62 and 64 are assembled together to form the contact module 44, the two flanges 140 and 142 form a substantially flat rectangular segment 144 having the contact portion 60 projecting therethrough as best seen in FIG. 8. The contact modules 44 are inserted into the openings 50 in the holder 42 so that the segment 144 of one adjacent contact module 44 is against a first major planar surface 146 and the segment 144 of the other adjacent contact module 44 is against a second major planar surface 148. The flanges 140 and 142 are dimensioned so that their ends abut or are in close proximity as indicated at 150 and their sides abut or come in close proximity with the opposite ends of adjacent contact modules 44 as indicated at 152. Thus, the plurality of segments 144 of the downwardly inserted contact modules 44, as viewed in FIG. 8, form a relatively flat, thin insulating sheet, although discontinuous, that will electrically insulate the holder 42 from the chip carrier 12. While not absolutely necessary, the ends of the upwardly inserted contact modules 44 which abut the sides of the flanges 144 at 152 also project above the surface 146 by an amount equal to the thickness of the segment 144, thereby partially filling in the space between adjacent segments 144. Similarly, the plurality of segments 144 of the upwardly inserted contact modules 44, form a relatively flat, thin insulating sheet that will electrically insulate the holder from the printed circuit board 14.

An important advantage of the present invention is that there is no dielectric between the metal plates 46 thereby minimizing the possibility of crosstalk between contacts. Since the plates are pressed together during operation, they are in intimate electrical contact between the contact modules 44.

Another important advantage of the present invention is that contacts may be placed on very small grids, such as for example, 0.050 inch or less.

The novel method of manufacturing the contact module and the interposer connector assembly as taught by the present invention is efficient and yields accurate matable parts having dimensions of the order of a few thousandths of an inch.

I claim:

1. A connector assembly for electrically connecting contact pads arranged in a first pattern on a surface of a first substrate to respective contact pads arranged in a second pattern on a surface of a second substrate comprising;

(a) a plurality of substantially identical contact modules, each of which includes an insulating body and a contact member having a resilient portion and first and second contact portions disposed at opposite ends of said resilient portion, each insulating body being of dielectric material and including a first part and a second part each of which have matable features including a portion of a cavity so that when said first and second parts are brought into engagement to form said body, said matable features interengage mutually aligning said parts to form an interior cavity containing said resilient portion of said contact member, wherein said first and second contact portions extend through openings in opposite sides of said insulating body; and (b) a holder having first and second parallel major planar surfaces, said holder having a plurality of openings for receiving said plurality of contact modules and spacing them so that all of said first and second contact portions extend outwardly from said first and second planar surfaces respectively and are in alignment with said first and second patterns of said contact pads on said first and second substrates respectively; and (c) means for holding said first and second substrates and said holder so that said first and second contact portions of some of said contact members are in contacting engagement with their respective contact pads on said first and second substrates.

2. The connector assembly according to claim 1 wherein each said insulating body includes a pair of opposing major surfaces which are substantially parallel and terminate in side portions of said contact module, and wherein each of said plurality of openings in said holder includes means for engaging said pair of opposing major surfaces and said side portions for aligning and securing said contact module within said opening.

3. The connector assembly according to claim 2 wherein said insulating body of each of said contact modules has the approximate shape of a parallelepiped 4. The connector assembly according to claim 1 wherein said resilient portion and said first and second contact portions substantially lie in a common plane within said interior cavity and said plurality of openings in said holder are arranged so that the common planes of each contact member are substantially parallel 5. The connector assembly according to claim 1 wherein said holder is composed of a plurality of relatively thin plates each of which includes said plurality of openings, said openings of one plate being in registry with corresponding openings in the other plates 6. The connector assembly according to claim 5 wherein said plates are metal and all of said openings are substantially identical in size and shape.

7. The connector assembly according to claim 6 wherein said plates are spot-welded together.

8. The connector assembly according to claim 1 wherein said first and second major surfaces are of rectangular shape having a length of about six to ten inches and the distance between said major surfaces is about 0.060 inch to about 0.130 inch.

9. The connector assembly according to claim 1 wherein said holder is electrically conductive and including insulating means interposed between said holder and said first and second substrates for electrically insulating said holder therefrom.

10. The connector assembly according to claim 9 wherein said insulating body of each contact module includes a flange formed integral therewith and said insulating means comprises a plurality of said flanges, and wherein said contact modules are arranged in said plurality of openings in said holder so that the flange of one of adjacent contact modules is against said first major planar surface and the flange of the other of said adjacent contact modules is against said second major planar surface.

* * * * *